[12] United States Patent
Shin et al.

(10) Patent No.: US 9,738,511 B2
(45) Date of Patent: Aug. 22, 2017

(54) REDUCTION OF CHIPPING DAMAGE TO MEMS STRUCTURE

(71) Applicant: InvenSense, Inc., San Jose, CA (US)

(72) Inventors: Jongwoo Shin, Pleasanton, CA (US); Kirt Reed Williams, Portola Valley, CA (US); Cerina Zhang, Sunnyvale, CA (US); Kuolung (Dino) Lei, San Jose, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/225,275

(22) Filed: Mar. 25, 2014

(65) Prior Publication Data

US 2015/0076631 A1   Mar. 19, 2015

Related U.S. Application Data

(60) Provisional application No. 61/877,691, filed on Sep. 13, 2013.

(51) Int. Cl.
*B81B 7/00* (2006.01)
*B81C 1/00* (2006.01)

(52) U.S. Cl.
CPC .. *B81C 1/00103* (2013.01); *B81C 2201/0112* (2013.01); *B81C 2201/0132* (2013.01); *B81C 2201/0133* (2013.01)

(58) Field of Classification Search
CPC ............ G01L 9/0042; B81B 2201/014; B81B 2203/0118; B81B 2203/0127; B81C 1/0015; B81C 1/00158; H01L 29/84; H01L 41/1136; H01L 41/1138
See application file for complete search history.

(56) References Cited

U.S. PATENT DOCUMENTS

| | | | |
|---|---|---|---|
| 6,759,340 B2* | 7/2004 | Nallan et al. | 438/714 |
| 7,999,440 B2* | 8/2011 | Miller | B81C 1/00158 310/324 |
| 8,551,692 B1* | 10/2013 | De Brabander et al. | 430/320 |
| 8,564,076 B1 | 10/2013 | Huang et al. | |

(Continued)

FOREIGN PATENT DOCUMENTS

DE   102010036217   3/2012

OTHER PUBLICATIONS

Office Action dated May 1, 2015 for U.S. Appl. No. 14/453,431, 12 pages.

(Continued)

*Primary Examiner* — Latanya N Crawford
(74) *Attorney, Agent, or Firm* — Amin, Turocy & Watson, LLP

(57) ABSTRACT

A MEMS (microelectromechanical systems) structure comprises a MEMS wafer. A MEMS wafer includes a cap with cavities bonded to a structural layer through a dielectric layer disposed between the cap and the structural layer. Unique configurations of MEMS devices and methods of providing such are set forth which provide for, in part, creating rounded, scalloped or chamfered MEMS profiles by shaping the etch mask photoresist reflow, by using a multi-step deep reactive ion etch (DRIE) with different etch characteristics, or by etching after DRIE.

6 Claims, 10 Drawing Sheets

(56) References Cited

U.S. PATENT DOCUMENTS

| | | | |
|---|---|---|---|
| 8,709,848 B2* | 4/2014 | Kundalgurki | G01L 9/0042 257/E21.002 |
| 9,040,355 B2* | 5/2015 | Bowles | B81C 1/0023 257/414 |
| 2002/0127760 A1 | 9/2002 | Yeh et al. | |
| 2004/0057589 A1* | 3/2004 | Pedersen et al. | 381/152 |
| 2005/0170656 A1 | 8/2005 | Nasiri et al. | |
| 2006/0208326 A1 | 9/2006 | Nasiri et al. | |
| 2006/0249797 A1 | 11/2006 | Nakazawa et al. | |
| 2007/0298581 A1* | 12/2007 | Kang | B81C 1/0015 438/396 |
| 2008/0017925 A1* | 1/2008 | Yamaguchi | B81C 1/0024 257/350 |
| 2008/0121611 A1* | 5/2008 | Miller et al. | 216/13 |
| 2010/0230776 A1 | 9/2010 | Gogoi | |
| 2011/0048132 A1 | 3/2011 | Rettig et al. | |
| 2012/0104589 A1 | 5/2012 | Kant et al. | |
| 2012/0236383 A1* | 9/2012 | Mizoguchi | H02K 33/18 359/223.1 |
| 2012/0236883 A1 | 9/2012 | Adler | |
| 2012/0264249 A1* | 10/2012 | Kundalgurki et al. | 438/50 |
| 2013/0214365 A1* | 8/2013 | Schlarmann et al. | 257/415 |
| 2014/0015123 A1* | 1/2014 | Bowles et al. | 257/737 |
| 2014/0191341 A1 | 7/2014 | Chu et al. | |
| 2014/0235032 A1 | 8/2014 | Akiyama et al. | |
| 2014/0308765 A1* | 10/2014 | Xie et al. | 438/21 |
| 2015/0076631 A1 | 3/2015 | Shin et al. | |
| 2015/0090661 A1* | 4/2015 | Kant et al. | 210/644 |

OTHER PUBLICATIONS

The International Search Report and the Written Opinion of the International Searching Authority for International Application No. PCT/US2015/027946, mailed Jul. 22, 2015, 10 pages.

Office Action dated Jun. 24, 2016 for U.S. Appl. No. 14/453,431, 18 pages.

Office Action dated Nov. 18, 2015 for U.S. Appl. No. 14/453,431, 19 pages.

Office Action dated Mar. 28, 2016 for U.S. Appl. No. 14/696,994, 23 pages.

Office Action dated Nov. 16, 2016 for U.S. Appl. No. 14/696,994, 24 pages.

Office Action dated Jun. 27, 2017 for U.S. Appl. No. 14/453,431, 16 pages.

\* cited by examiner

REDUCTION OF CHIPPING DAMAGE TO MEMS STRUCTURE

CROSS-REFERENCE TO RELATED APPLICATION

This application claims benefit under 35 USC 119(e) of U.S. Provisional Patent Application No. 61/877,691, filed on Sep. 13, 2013, entitled "REDUCTION OF CHIPPING DAMAGES OF MEMS STRUCTURE INDUCED BY MECHANICAL SHOCK," which is incorporated herein by reference in its entirety.

FIELD OF THE INVENTION

The present invention relates generally to MEMS (Microelectromechanical systems) devices and more particularly relates to MEMS devices that are uniquely configured for improved performance.

BACKGROUND OF THE INVENTION

MEMS devices are utilized in a variety of environments. MEMS devices may encounter damage, such as chipping, typically induced by mechanical shock as structures bump into one another depending on their arrangement.

FIG. 1 sets forth a typical arrangement of two devices placed proximate to one another in a MEMS device. From FIG. 1, a MEMS structure 105 is situated near a current-profile MEMS device 130. The typical appearance of chipping damage induced by the structures where bumping with one another due to mechanical shock may occur is identified at 150. It will be appreciated by those skilled in the art that chipping damage may occur where two structures (105, 130) make contact with each other when mechanical shock is applied and can be found from an actuator layer surface facing a second substrate (not shown). It will be further appreciated that chipping damage may often be more problematic on the side that is facing for example a substrate because chipped silicon pieces may fall on to the metal electrodes on the substrate and create the opportunity for electrical shorts between electrodes that intended to be isolated.

Unfortunately, with ever-increasing density demands for chip placement in circuitry, the potential for chipping damage and electrical short situations are increasing such that increasing dimensional placement between devices is not a viable option. What is therefore desired is a device and method that overcomes these challenges and provides for arranging MEMS in proximity to one another, in densely-packed arrangements, with unique sidewall or substrate configurations that reduce the likelihood of chipping and electrical shorting.

SUMMARY OF THE INVENTION

The present invention fulfills these needs and has been developed in response to the present state of the art, and in particular, in response to the problems and needs in the art that have not yet been fully solved by currently available technologies.

One embodiment of the present invention provides for an integrated MEMS device comprising: a first substrate and a second substrate, where the first substrate is bonded to the second substrate and the sidewalls of one of the first substrate and the second substrate include scallops with reduced depth. A further embodiment provides for an integrated MEMS device that further includes the MEMS substrate having a cap coupled to a MEMS structural layer.

Another embodiment of the present invention provides for an integrated MEMS device comprising: a MEMS substrate; and a IC substrate, wherein the MEMS substrate is bonded to the IC substrate; wherein the MEMS substrate includes rounded corners. A further embodiment provides for the integrated MEMS device first substrate being a MEMS substrate including a cap coupled to a MEMS structural layer.

Another embodiment of the present invention provides for a method for providing rounded corners on a MEMS substrate. The method includes patterning a photoresist mask defining MEMS structures on the MEMS substrate and applying high temperature to the patterned photoresist mask to round corners of the photoresist mask. Further the method provides for etching the MEMS substrate using the rounded patterned photoresist mask, wherein top corners of the MEMS substrate are rounded.

A further embodiment of the present invention provides for a method for providing rounded corners on a MEMS substrate comprising: patterning a photoresist mask defining MEMS structures on the MEMS substrate; applying high temperature to the patterned photoresist mask to round corners of the photo resist mask; and shallow etching of the MEMS substrate using the rounded photoresist mask; non-selective etch resulting in rounding of top corners in the MEMS substrate. The method also provides for removing and applying a second photoresist mask defining the shape of MEMS structure, and applying a deep reactive ion etch (DRIE) process to achieve vertical sidewalls in the remaining portion of MEMS structure.

Other aspects and advantages of the present invention will become apparent from the following detailed description, taken in conjunction with the accompanying drawings, illustrating by way of example the principles of the invention.

DETAILED DESCRIPTION

Figure 1:
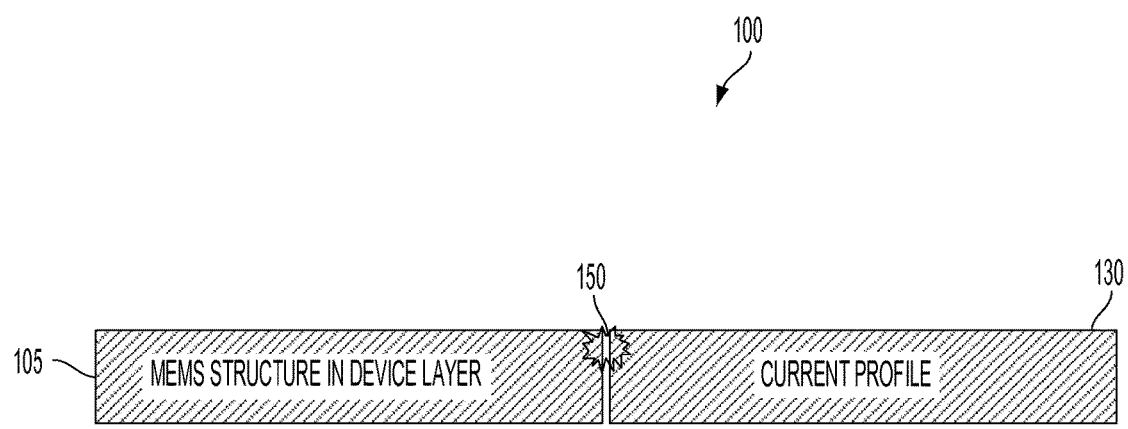
FIG. 1 sets forth a typical arrangement of two MEMS devices placed proximate to one another.

The present invention relates generally to the fabrication of MEMS devices, and more particularly to providing for rounding corners and/or providing scalloping on MEMS substrates. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

In the described embodiments micro-electro-mechanical systems (MEMS) refers to a class of structures or devices fabricated using semiconductor-like processes and exhibiting mechanical characteristics such as the ability to move or deform. In the described embodiments, the MEMS device may refer to a semiconductor device implemented as a micro-electro-mechanical system. The MEMS structure may refer to any feature that may be part of a larger MEMS device. MEMS devices often, but not always, interact with electrical signals. MEMS devices include but are not limited to gyroscopes, accelerometers, magnetometers, pressure sensors, microphones, and radio-frequency components. Silicon wafers containing MEMS structures are referred to as MEMS wafers.

A structural layer may refer to the silicon layer with moveable structures. An engineered silicon-on-insulator (ESOI) wafer may refer to an SOI wafer with cavities beneath the silicon structural layer. A cap wafer typically refers to a thicker substrate used as a carrier for the thinner silicon device substrate in a silicon-on-insulator wafer.

A MEMS substrate provides mechanical support for the MEMS structure. The MEMS structural layer is attached to the MEMS substrate. The MEMS substrate is also referred to as handle substrate or handle wafer. In some embodiments, the handle substrate serves as a cap to the MEMS structure. A cap or a cover provides mechanical protection to the structural layer and optionally forms a portion of the enclosure. Standoff defines the vertical clearance between the structural layer and the IC substrate. Standoff may also provide electrical contact between the structural layer and the IC substrate. Standoff may also provide a seal that defines an enclosure. Integrated Circuit (IC) substrate may refer to a silicon substrate with electrical circuits, typically CMOS circuits. A cavity may refer to a recess in a substrate. Chip includes at least one substrate typically formed from a semiconductor material. A single chip may be formed from multiple substrates, where the substrates are mechanically bonded together. Multiple chip includes at least 2 substrates, wherein the 2 substrates are electrically connected, but do not require mechanical bonding.

A system and method in accordance with the present invention overcomes the limitations described in the known art, in part, by creating rounding or chamfered MEMS profiles by shaping the etch mask photoresist using reflow or by using multi step deep reactive ion etch (DRIE) with different etch characteristics.

Figure 2A:
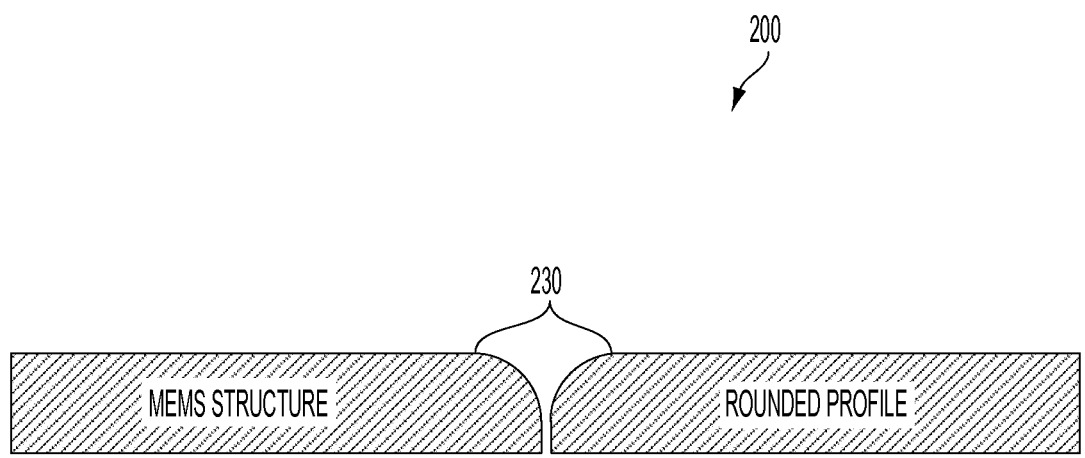
FIGS. 2a and 2b sets forth an example of MEMS profiles attained through the use of the present invention in which chipping reduction is improved by rounding off sharp corners from an actuator surface or by creating chamfered actuator profile.
Figure 2B:
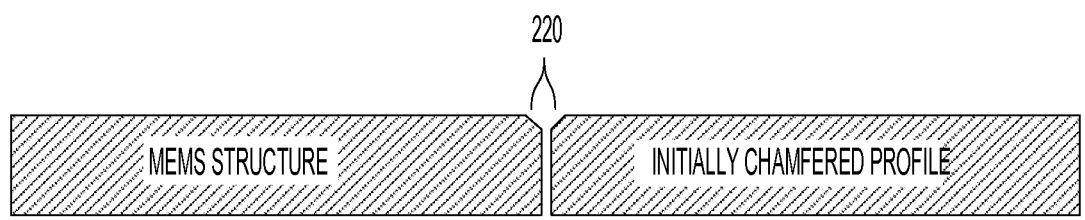
Figure 3A:
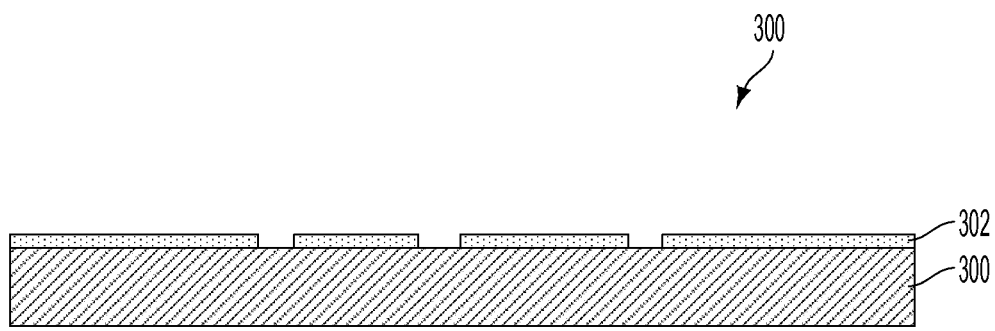
FIGS. 3A-3E are diagrams that illustrate using the present invention for a MEMS structure etch process creating a rounded corner at the surface using a two-step etch process.
Figure 3B:
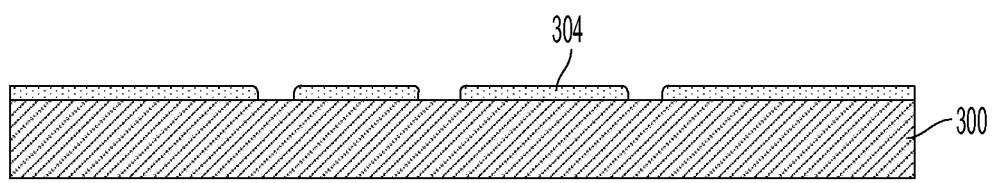
Figure 3C:
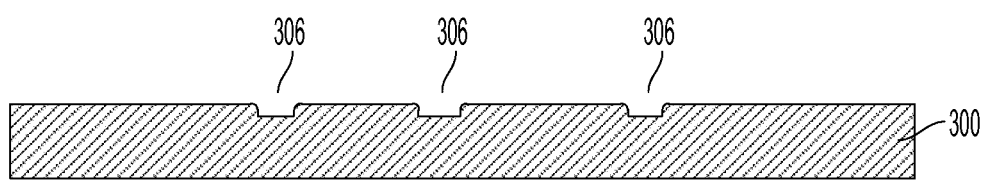
Figure 3D:
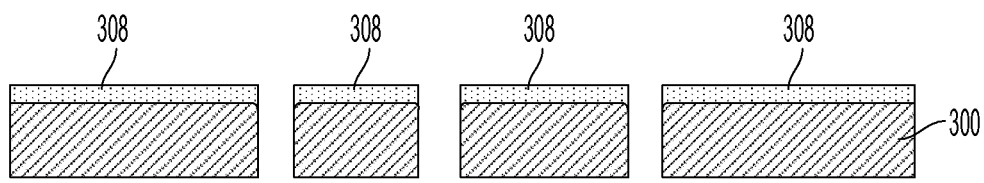
Figure 3E:
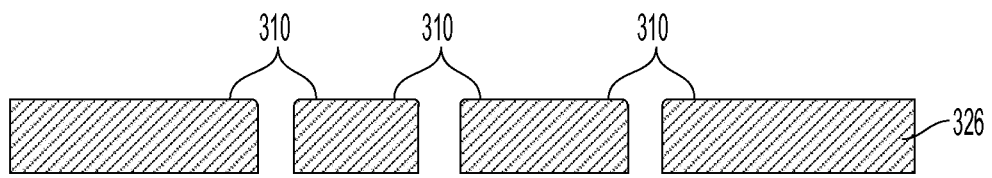

FIGS. 2a and 2b sets forth an example of a MEMS structure 200 in accordance with an embodiment. By removing sharp corners from the structural layer by creating an initially chamfered profile 220 on the MEMS structure 200 and a rounded profile 230 on the MEMS structure 200 chipping is significantly reduced.

FIGS. 3A-3E are diagrams that illustrate using the present invention for a process to etch a MEMS structure with a rounded corner at the surface using a two-step etch process. In a first step, a photoresist etch mask 302 is provided on a substrate 300 at FIG. 3A. At FIG. 3B, a rounding photoresist mask 304 is provided with photoresist reflow for example by applying a high temperature. At FIG. 3C, substrate 300 is etched with the rounded photoresist mask, using a low selectivity etch resulting in rounded corners 306 in the etched silicon. At FIG. 3D, a second photoresist etch mask 308 is applied. At FIG. 3E, the silicon substrate is etched using a deep reactive ion etch (DRIE) to complete patterning the substrate 300. As is seen a finished substrate 326 with rounded corners 310 is provided. In an embodiment the substrate 326 comprises a structural layer of a MEMS device.

Figure 4A:
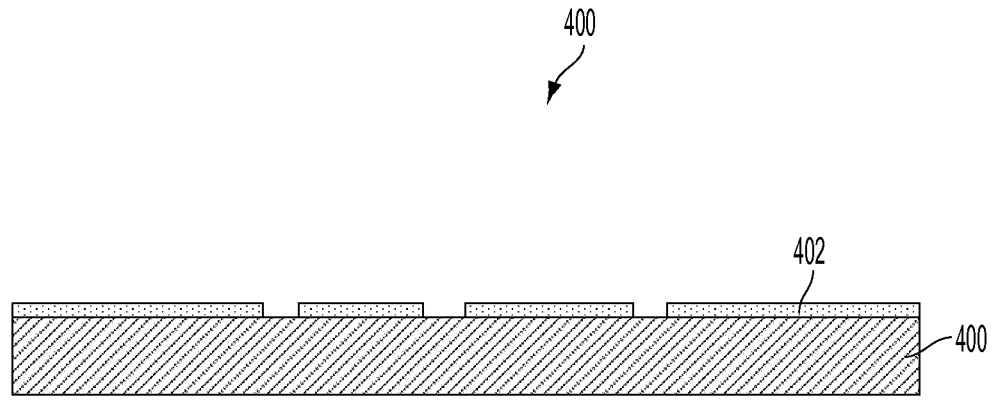
FIGS. 4A-4C are diagrams that illustrate using the present invention for a MEMS structure etch process creating rounded corners at the surface using a single-step etch process.
Figure 4B:
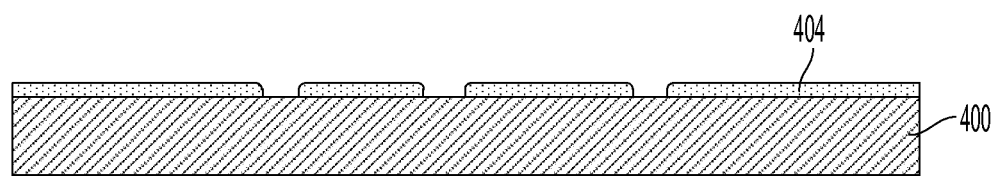
Figure 4C:
Figure 5A:
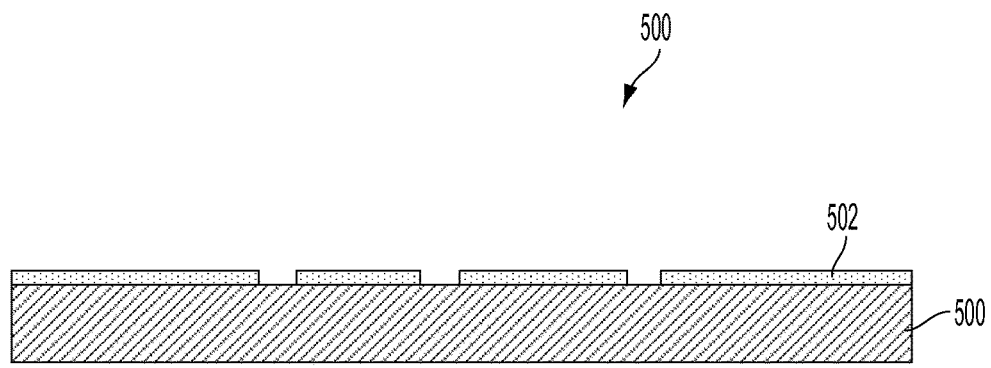
FIGS. 5A-5D are diagrams that illustrate using the present invention for a MEMS structure etch process creating a chamfered corner at the surface.
Figure 5B:
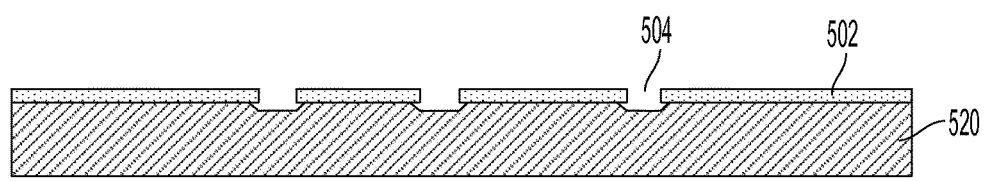
Figure 5C:
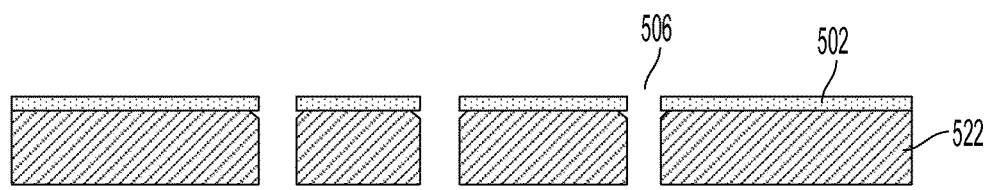
Figure 5D:
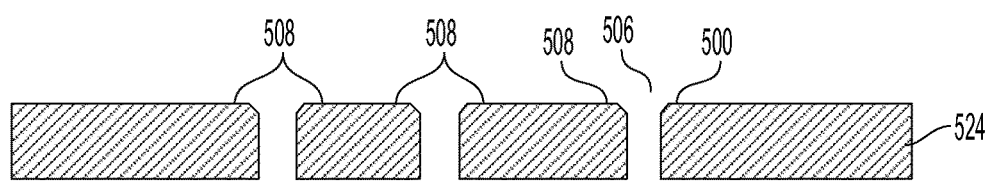

FIGS. 4A-4C are diagrams that illustrate using the present invention for a process to etch a MEMS structure to create rounded corners at the surface using a single step etch process. In a first step at FIG. 4A, the lithography creating photoresist etch mask 402 is provided on the substrate 400. At FIG. 4B, a rounding photoresist mask 404 using photoresist reflow by applying high temperature is set forth. At FIG. 4C, a DRIE etch is provided to remove the mask and etch the substrate 400 with rounded corners.

FIGS. 5A-5D are diagrams that illustrate using the present invention for a process to etch a MEMS structure creating chamfered corners at the surface. In a first step, FIG. 5A, a photoresist etch mask 502 is provided on the substrate 500. At FIG. 5B, substrate 500 with etch mask 502 is etched to result in a tapered profile and undercut 504 using techniques known in the art results in substrate 520. At FIG. 5C, substrate 520 is etched using a DRIE silicon etch to complete etching the trench 506 and resulting in substrate 522 with chamfered corners. At FIG. 5D, an example of a finished substrate 524, with chamfered corners 508 by removing the photoresist mask 502. In an embodiment, substrate 524 is a structural layer of a MEMS device.

It will be further appreciated that the present invention provides for another aspect of DRIE process used to pattern the MEMS structure with vertical sidewalls may include that affecting the sidewall roughness or scallops. In embodiment, smooth sidewalls or scallops with reduced depth may be preferable, as structures with smooth sidewalls typically have higher fracture strength than structures with scalloped sidewalls. The present invention provides for such implementation.

Figure 6:
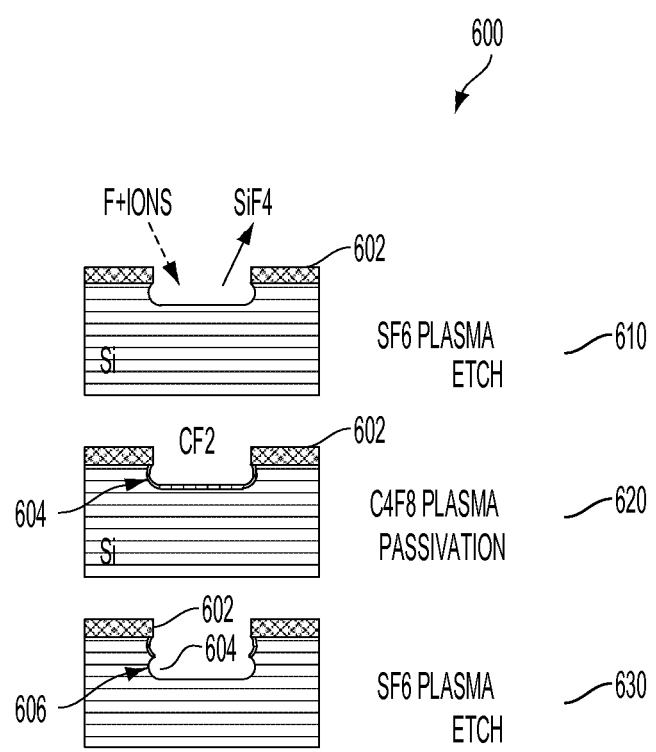
FIG. 6 provides a visual representation of an approach in which etched sidewall roughness or scallops are created during a DRIE process of the present invention.

FIG. 6 provides a visual representation 600 of an approach for the etched sidewall roughness or scallops creation during a DRIE process. From FIG. 6, due to the isotropic nature of a plasma etch at 610 such as sulfur hexafluoride (SF6), sidewall passivation with for example a fluorocarbon polymer is used between plasma-etch steps in order to maintain a vertical etched sidewall profile at 620. By repeating the etch and the passivation cycles, features with a vertical etched profile can be created. However, due to cyclic etch and deposition, the resulting sidewall 602 will have scallops 604 and 606 or sidewall roughness which can be considered as flaw in a single crystal silicon structure at 630.

Using a system and method in accordance with the present invention, scallops can be reduced to 50 nm or less for example using one or more approaches as set forth in one or more embodiments. For instance, in one embodiment, the duration of etch is reduced as is the passivation deposition cycle time which thereby results in reduction of size of the scallops. In another approach, using isotropic or anisotropic wet etching after the DRIE process, the tips of the scallops are etched faster than the scallop low areas.

Figure 7:
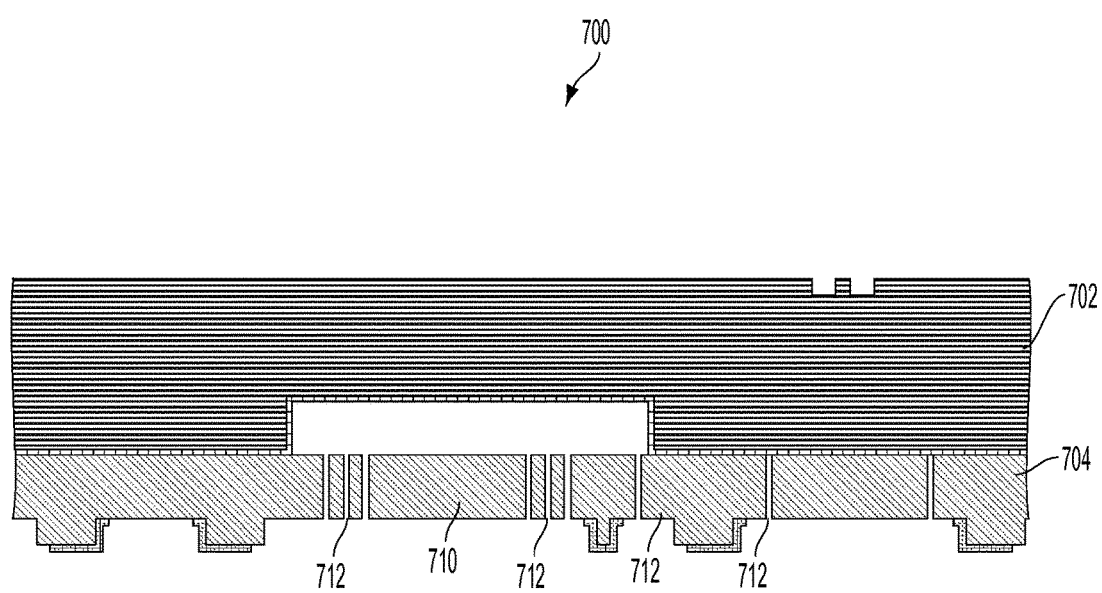
FIG. 7 sets forth an example of crystal-plane orientation in silicon wafer with structures oriented in 0 or 90 degree direction from a wafer notch or flat.

FIG. 7 sets forth an example of crystal plane orientation in silicon wafer with a movable structure 710 oriented in 0 or 90 degree direction from a wafer notch or flat. In this embodiment a cap 702 is bonded to a MEMS structural layer 704. In the silicon wafer 700 the vertical sidewalls 712 of structures defined by DRIE are in need of an anisotropic etch solution composition for the present invention in order to remove scallops from the vertical sidewall surface.

Figure 8:
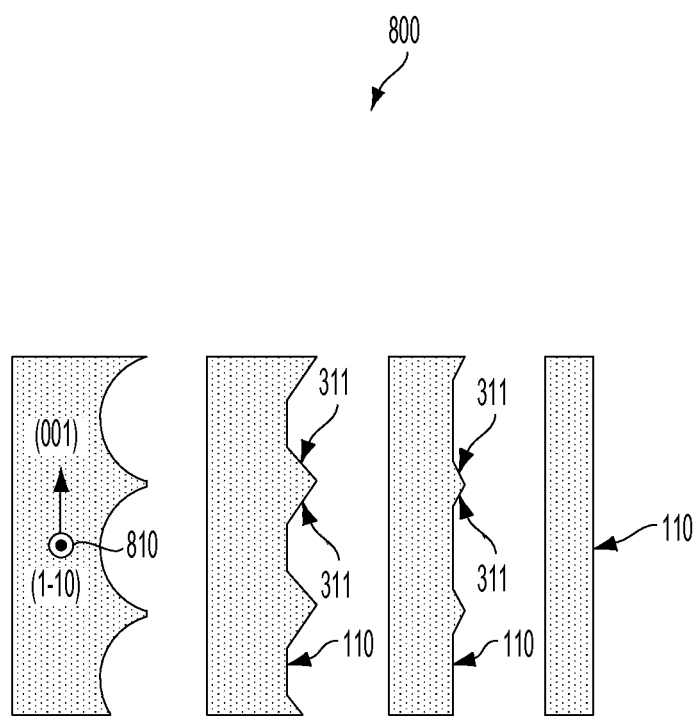
FIG. 8 sets forth a series of cross section drawings of trench-profile changes during anisotropic wet etching, in accordance with the present invention.
Figure 9A:
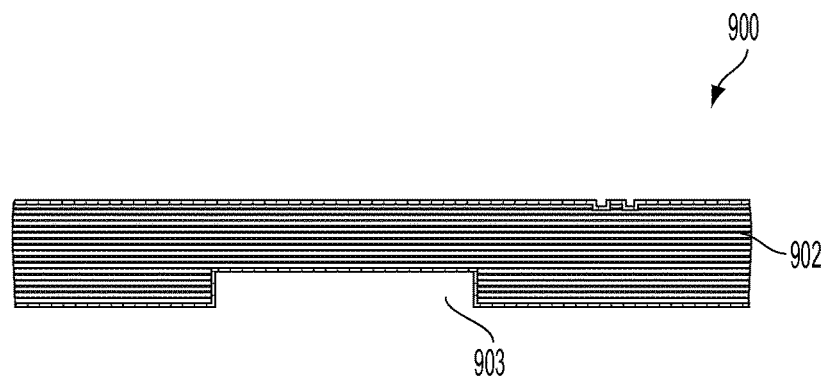
FIGS. 9A-9G are diagrams that illustrate a process of scallop reduction or removal that benefits the manufacturing of a MEMS device with a MEMS substrate and an IC substrate bonded using Al—Ge eutectic bonding, for instance.
Figure 9B:
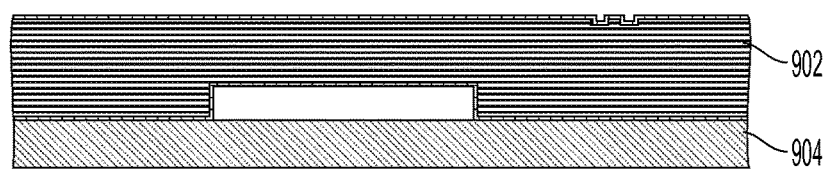
Figure 9C:
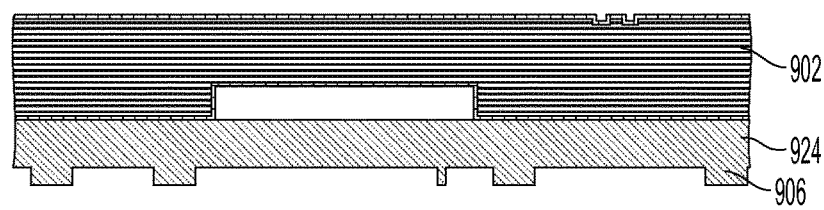
Figure 9D:
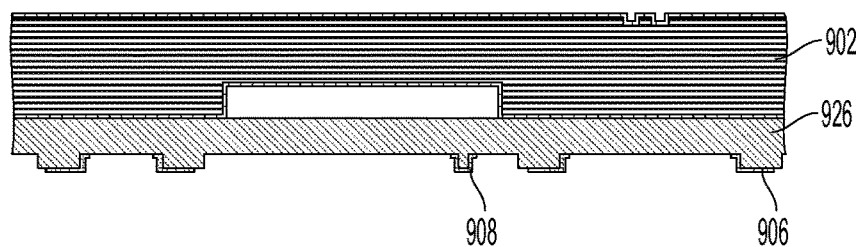
Figure 9E:
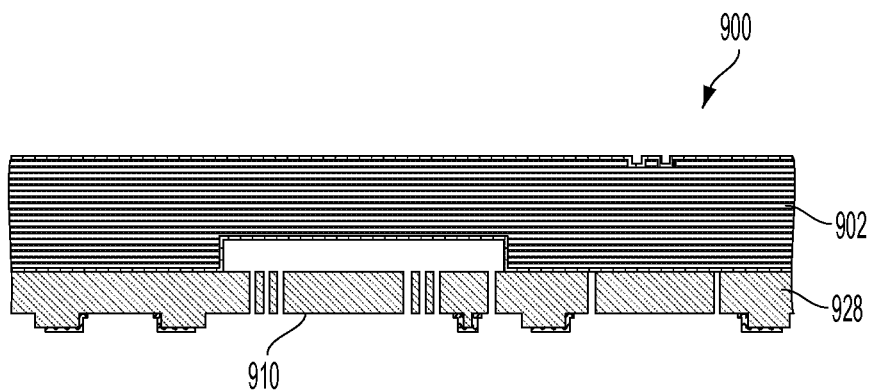
Figure 9F:
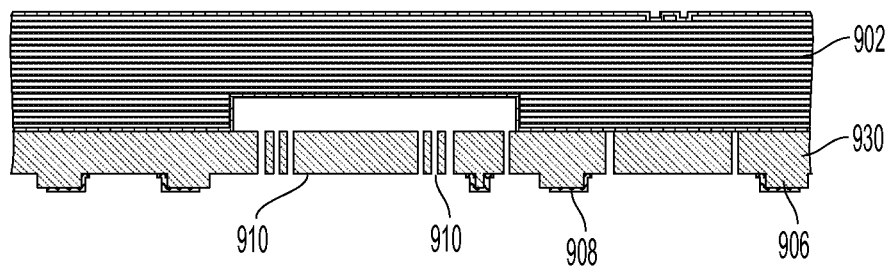
Figure 9G:
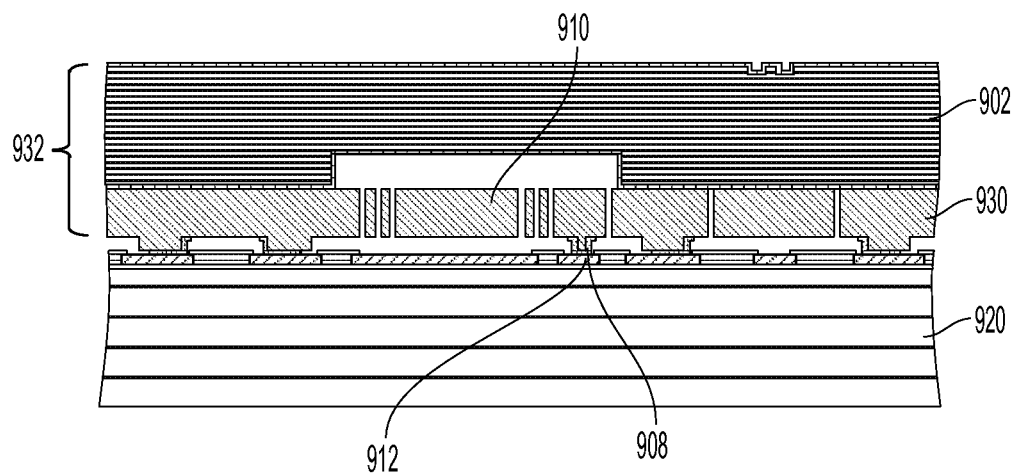

An example of reduction of depth using an anisotropic etchant is shown in FIG. 8. FIG. 8 sets forth a series of cross section drawings 800 of trench profile changes during anisotropic wet etching. From FIG. 8, the trench profile changes at 810 during anisotropic wet etching to reveal fast-etching type {311} crystal planes and smooth type {110} planes (110) as desired, using the present invention. {311} and {110} indicate the orientation of crystal planes. Due to the orientation dependency of etch rate, an anisotropic wet etch typically etches scallop tips faster than the scallop low areas for the present invention. Similarly, in a further embodiment, an isotropic wet etch of silicon can be used to reduce the size of scallops because an isotropic etch also can effectively reduce sharp corners, and reducing the depth of the scallop and result in smoother surface.

In an embodiment, a sidewall roughness (i.e., scallop) reduction can be achieved after the patterning of substrates in a device silicon layer using a DRIE process in accordance with the present invention. For instance, a MEMS cap with an etched cavity is bonded to a MEMS structural layer with a thin dielectric layer in between. In an embodiment, standoffs are then patterned in the structural layer followed by deposition and patterning of a germanium pad. MEMS structures may then, in one or more embodiments, be patterned using lithography and DRIE of structural layer silicon resulting in sidewalls with scallops. An anisotropic wet etch, or an isotropic wet or dry etch, may be applied to reduce the depth of sidewall scallops at this stage of process flow.

Anisotropic etching of silicon can then be achieved by using etchants such as any of potassium hydroxide (KOH), tetramethylammonium hydroxide (TMAH), (ethylenediamine pyrocatechol (EDP), or sodium hydroxide (NaOH) or other alkaline solutions with or without additives such as isopropyl alcohol (IPA), a first non-ionic surfactant NCW-601A, a second non-ionic surfactant (Triton X-100), a third non-ionic surfactant (NCW-1002) or other surfactants. Isotropic etching of silicon can be achieved by using etchants such as a combination of hydrofluoric, nitric, and acetic acids or by using gases such as xenon difluoride (XeF2) or sulfur hexafluoride (SF6) with or without plasma. Finally, it will be appreciated that a MEMS substrate and a IC substrate can be bonded using Al—Ge eutectic bonding process to form electrical connection between IC pads 912 and MEMS pads 908 as well as a hermetically sealed cavity.

FIGS. 9A-9G are diagrams that illustrate a process of reduction of scallop depth that benefits the manufacturing of a MEMS device with a MEMS substrate and an IC substrate bonded using Al—Ge eutectic bonding, for instance. In an embodiment, a MEMS cap 902 with a cavity 903 is etched. Silicon oxide is deposited on the surface of cap 902 at FIG. 9A. At FIG. 9B, the structural layer 904 is fusion bonded to the MEMS cap 902 and thinned/polished. At FIG. 9C, a standoff 906 is formed by etching structural layer 904 resulting in 924. At FIG. 9D, an electrical conductor such as germanium 908 is deposited on the structural layer 924 and patterned as in 926. At FIG. 9E, structural layer 926 is patterned by a DRIE process with scallops on the etched sidewalls of the structural layer 928 releasing movable structure 910. At FIG. 9F, a post DRIE anisotropic wet etch or isotropic wet or dry etch process is employed to reduce the depth of sidewall scallops on the structural layer sidewalls 928. At FIG. 9G, the MEMS cap with structural layer 932 and an IC substrate 920 are bonded by Al—Ge eutectic bonding forming an electrical connection between the IC substrate 920 and the structural layer 930, as well as a hermetically sealed cavity.

In the described embodiments, the device can be any MEMS device with a moveable structure such as but not limited to accelerometer, gyroscope, magnetic sensors and resonators. In the described embodiments, the IC substrate can include electronic circuits for sensing and processing the motion of the MEMS device, without limitation. One skilled in the art would appreciate that the IC substrate 920 can be substituted with any type of substrate such as a ceramic substrate or a silicon substrate.

Any theory, mechanism of operation, proof, or finding stated herein is meant to further enhance understanding of the present invention and is not intended to make the present invention in any way dependent upon such theory, mechanism of operation, proof, or finding. It should be understood that while the use of the words preferable, preferably, or preferred in the description above indicates that the feature so described may be more desirable, it nonetheless may not be necessary and embodiments lacking the same may be contemplated as within the scope of the invention, that scope being defined by the claims that follow.

Although the present invention has been described in accordance with the embodiments shown, one of ordinary skill in the art will readily recognize that there could be variations to the embodiments and those variations would be within the spirit and scope of the present invention, such as the inclusion of circuits, electronic devices, control systems, and other electronic and processing equipment. Accordingly, many modifications may be made by one of ordinary skill in the art without departing from the spirit and scope of the appended claims. Many other embodiments of the present invention are also envisioned.

What is claimed is:

1. A microelectromechanical systems (MEMS) device comprising:
   a MEMS substrate, wherein the MEMS substrate includes a movable MEMS structure; and
   an integrated-circuit (IC) substrate, wherein the MEMS substrate is bonded to the IC substrate, wherein a profile of the movable MEMS structure includes substantially rounded corners, wherein the profile is in a plane perpendicular to plane of the MEMS substrate, and wherein the MEMS substrate includes a silicon cap substrate including a cavity coupled to a MEMS structural layer, wherein the substantially rounded corners reside in the MEMS structural layer.

2. The MEMS device of claim 1, wherein the silicon cap substrate and the MEMS movable structure comprise any of single crystal silicon materials or polycrystalline silicon materials.

3. A method for providing rounded corners on a microelectromechanical systems (MEMS) substrate comprising:
  creating a patterned photoresist mask by patterning a photoresist mask defining MEMS structures on the MEMS substrate;
  creating a rounded photoresist mask by applying high temperature to the patterned photoresist mask to round corners of the patterned photoresist mask;
  shallow etching the MEMS substrate using the rounded photoresist mask;
  non-selective etching of the MEMS substrate resulting in rounding of top corners in the MEMS substrate;
  removing the rounded photoresist mask and applying a second photoresist mask defining at least one shape of the MEMS structures; and
  applying a deep reactive ion etch (DRIE) process to achieve vertical sidewalls in a remaining portion of the MEMS structures.

4. A method comprising:
  etching a microelectromechanical systems (MEMS) substrate to create rounded top corners of MEMS structures in the MEMS substrate as defined by a first photoresist mask;
  applying a second photoresist mask to the MEMS substrate that defines at least one shape of the MEMS structures; and
  etching the MEMS substrate with a deep reactive ion etch (DRIE) process to achieve vertical sidewalls in a remaining portion of the MEMS structures.

5. The MEMS device of claim 1, wherein a dielectric layer is disposed between the silicon cap substrate and the MEMS structural layer comprising the movable MEMS structure.

6. The MEMS device of claim 1, wherein the silicon cap substrate is fusion bonded to the MEMS structural layer.

* * * * *